United States Patent
Yu et al.

(10) Patent No.: US 6,906,922 B2
(45) Date of Patent: Jun. 14, 2005

(54) INTEGRATED HEAT-DISSIPATING MODULE

(75) Inventors: Tsung-Hsi Yu, Taipei (TW); Hung Chang, Taipei (TW)

(73) Assignee: Micro-Star Int'l Co., Ltd., Jung-He (TW)

(*) Notice: Subject to any disclaimer, the term of this patent is extended or adjusted under 35 U.S.C. 154(b) by 206 days.

(21) Appl. No.: 10/461,470

(22) Filed: Jun. 16, 2003

(65) Prior Publication Data

US 2004/0150952 A1 Aug. 5, 2004

(30) Foreign Application Priority Data

Jan. 30, 2003 (TW) .................................. 92201943 U

(51) Int. Cl.[7] .............................................. H05K 7/20
(52) U.S. Cl. .................. 361/697; 361/703; 361/690; 257/722; 165/80.3; 165/121
(58) Field of Search ........................ 361/687, 694, 361/685, 697, 703; 257/722; 165/80.3, 121, 122

(56) References Cited

U.S. PATENT DOCUMENTS

| | | | | |
|---|---|---|---|---|
| 6,023,413 A | * | 2/2000 | Umezawa ................... 361/697 |
| 6,091,603 A | * | 7/2000 | Daves et al. ................ 361/704 |
| 6,330,906 B1 | * | 12/2001 | Wang ......................... 165/80.3 |
| 6,396,693 B1 | * | 5/2002 | Shih ........................... 361/703 |
| 6,711,016 B2 | * | 3/2004 | Chung et al. ............... 361/695 |
| 6,763,881 B1 | * | 7/2004 | Wagner et al. ............. 165/121 |
| 6,832,410 B2 | * | 12/2004 | Hegde ....................... 165/80.3 |
| 2002/0024796 A1 | * | 2/2002 | Shih ........................... 361/703 |

* cited by examiner

Primary Examiner—Lynn Feild
Assistant Examiner—Zachary M. Pape
(74) Attorney, Agent, or Firm—Winston Hsu

(57) ABSTRACT

An integrated heat-dissipating module includes a heat-dissipating device substantially in contact with a main heat-generating source on a motherboard, a casing capping over the main heat-generating source and substantially in contact with sub heat-generating sources installed around the main heat-generating source, and a heat-dissipating fan installed on a first vent of the casing. The heat produced by the main heat-generating source is transmitted to the air inside the casing via the heat-dissipating device. Then, the hot airflow concentrated within the casing is expelled from a second vent of the casing by the heat-dissipating fan. The casing is made of a high heat conducting material and has a plurality of external heat-dissipating fins extending outward from an outer surface of the casing for quickly transmitting the heat generated by the sub heat-generating sources to the outside. Heat produced by the main heat-generating source and the sub heat-generating sources is dissipated simultaneously.

6 Claims, 2 Drawing Sheets

INTEGRATED HEAT-DISSIPATING MODULE

BACKGROUND OF INVENTION

1. Field of the Invention

The present invention relates to an integrated heat-dissipating module, and more particularly, to an integrated heat-dissipating module capable of dissipating the heat produced by a main heat-generating source installed on a computer motherboard and dissipating the heat produced by a sub heat-generating source installed around the main heat-generating source simultaneously in order to reduce a temperature of a computer host.

2. Description of the Prior Art

For meeting the requirements of high integration and fast processing speed, each high-level computer such as a Rack-Mount Internet server or various types of dedicated servers has a lot of components that produce a great quantity of heat as they are operated. Accordingly, a requirement of heat dissipation is quite important for the high-level computer in order to hold a temperature of each component inside the computer host within a suitable range of temperatures so that the component can function normally. However, a heat-dissipating fan used by a conventional computer is insufficient to a high-level computer having a high density of components, so that the heat in the computer host cannot be effectively expelled to the outside by the conventional heat-dissipating fan, which easily leads to a breakdown of devices or a shutdown of systems. As a result, a heat-dissipating apparatus 1 shown in FIG. 1 is usually applied in a current server. The heat-dissipating apparatus 1 comprises a saddle-like casing 11 made of a plastic material, and a heat-dissipating fan 12 installed on a side of the saddle-like casing 11. The saddle-like casing 11 is installed on a motherboard 2 for capping a main heat-generating source 3 that will produce a lot of heat while it is operated, such as a central processing unit (CPU) or a chipset. The heat-dissipating fan 12 is installed on a rear vent (not shown in FIG. 1) of the saddle-like casing 11. Additionally, when the heat-dissipating fan 12 is running, it guides cool air into the saddle-like casing 11 so that the cool air absorbs the heat produced by the main heat-generating source 3 for cooling the air inside the saddle-like casing 11 and decreasing a temperature of the main heat-generating source 3. Finally, the produced hot air is expelled to the outside of a computer housing of the server via a front vent 111 of the saddle-like casing 11. Since the airflow produced by the heat-dissipating fan 12 is concentrated around the main heat-generating source 3 by the saddle-like casing 11, the heat produced by the main heat-generating source 3 can be effectively dissipated so that the heat-dissipating efficiency for the main heat-generating source 3 can be improved. However, the above-mentioned method is only utilized to dissipate the heat produced by the main heat-generating source 3 in a host. In addition to the main heat-generating source 3, sub heat-generating sources, such as a MOSFET voltage modulator or an expansion card inserted in a slot, may also generate heat as they are operated. Even though the heat produced by the sub heat-generating sources is less than that produced by the main heat-generating source, it will be accumulated inside the host and will lead to a breakdown of systems if the heat produced by the sub heat-generating sources is not ejected from the host. Moreover, the heat-dissipating apparatus 1 is only limited to dissipate the heat produced by the main heat-generating source 3 in the host, but it does not function to dissipate the heat produced by the sub heat-generating sources. Accordingly, it is necessary to equip the heat-dissipating apparatus 1 with other heat-dissipating devices such as a fan or heat-dissipating fins for dissipating the heat produced by the sub heat-generating sources, and that would result in a high production cost and occupying too much space.

Since the current trend of electronic devices is towards high integration, high performance, and high power efficiency, the heat-dissipating apparatus 1 apparently cannot meet the requirements of the current electronic devices. For satisfying the requirements of the current electronic devices, a heat-dissipating apparatus should be oriented towards an integrated module capable of performing heat dissipation simultaneously for the main heat-generating source and the sub heat-generating sources for reducing a production cost and a space occupied by the integrated module.

SUMMARY OF INVENTION

It is therefore a primary objective of the claimed invention to provide an integrated heat-dissipating module for effectively dissipating the heat produced by the main heat-generating source and the sub heat-generating sources in order to improve a heat-dissipating efficiency and to reduce a production cost and a space occupied by the integrated heat-dissipating module.

Accordingly, since a computer motherboard comprises not only a main heat-generating source capable of producing a large quantity of heat but also sub heat-generating sources capable of producing less heat than the main heat-generating source, the claimed invention can dissipate the heat produced by the two kinds of heat-generating sources inside a host simultaneously for improving the efficiency of the heat dissipation. The integrated heat-dissipating module comprises a heat-dissipating device substantially in contact with the main heat-generating source on a motherboard, a casing made of a high heat conducting material having two vents, and a heat-dissipating fan installed on one of the vents of the casing for forming airflow inside the casing. The heat generated by the main heat-generating source is absorbed and transmitted by the heat-dissipating device, and then, it is diffused into the air inside the casing. Following that, a heat exchange is carried out between the heat transmitted by the heat-dissipating device and the airflow inside the casing produced by the heat-dissipating fan. Thereafter, the hot airflow will be expelled from another vent of the casing for dissipating the heat released by the main heat-generating source. Moreover, the casing comprises two connecting plates substantially in contact with the sub heat-generating sources, and a plurality of external heat-dissipating fins extending outward from an outer surface of the casing for increasing a heat-dissipating area of the casing. The heat produced by the sub heat-generating sources is absorbed by the connecting plates and transmitted to the external heat-dissipating fins for dissipating the heat produced by the sub heat-generating sources and thus reducing temperatures of the sub heat-generating sources. As a result, the integrated heat-dissipating module of the claimed invention can dissipate not only the heat generated by the main heat-generating source but also the heat generated by the sub heat-generating sources for reducing a temperature of the host effectively. Accordingly, the claimed invention can reach an excellent heat-dissipating efficiency with cost-saving and space-saving advantages.

These and other objectives of the present invention will no doubt become obvious to those of ordinary skill in the art after reading the following detailed description of the preferred embodiment, which is illustrated in the multiple figures and drawings.

DETAILED DESCRIPTION

The above-mentioned techniques, characteristics, and purposes will be clearly disclosed in the following description of the preferable embodiment accompanying with corresponding figures.

Additionally, a computer recited in the following preferable embodiment is the equipment that can process a logical operation, such as a server or a personal computer. Each of the above-mentioned computers includes a main heat-generating source that would produce a lot of heat as it is operated, such as a central processing unit or a chipset installed on a motherboard. Furthermore, each of the above-mentioned computers includes other components installed around the main heat-generating source, such as a MOSFET voltage modulator, an expansion card inserted in a slot and so on, which may generate heat when they are operated. In the following preferable embodiment, the components are represented by sub heat-generating sources, and the following description will clearly introduce a structure and a position of the integrated heat-dissipating module and explain how to dissipate the heat released by the main heat-generating source and the sub heat-generating sources.

Figure 1:
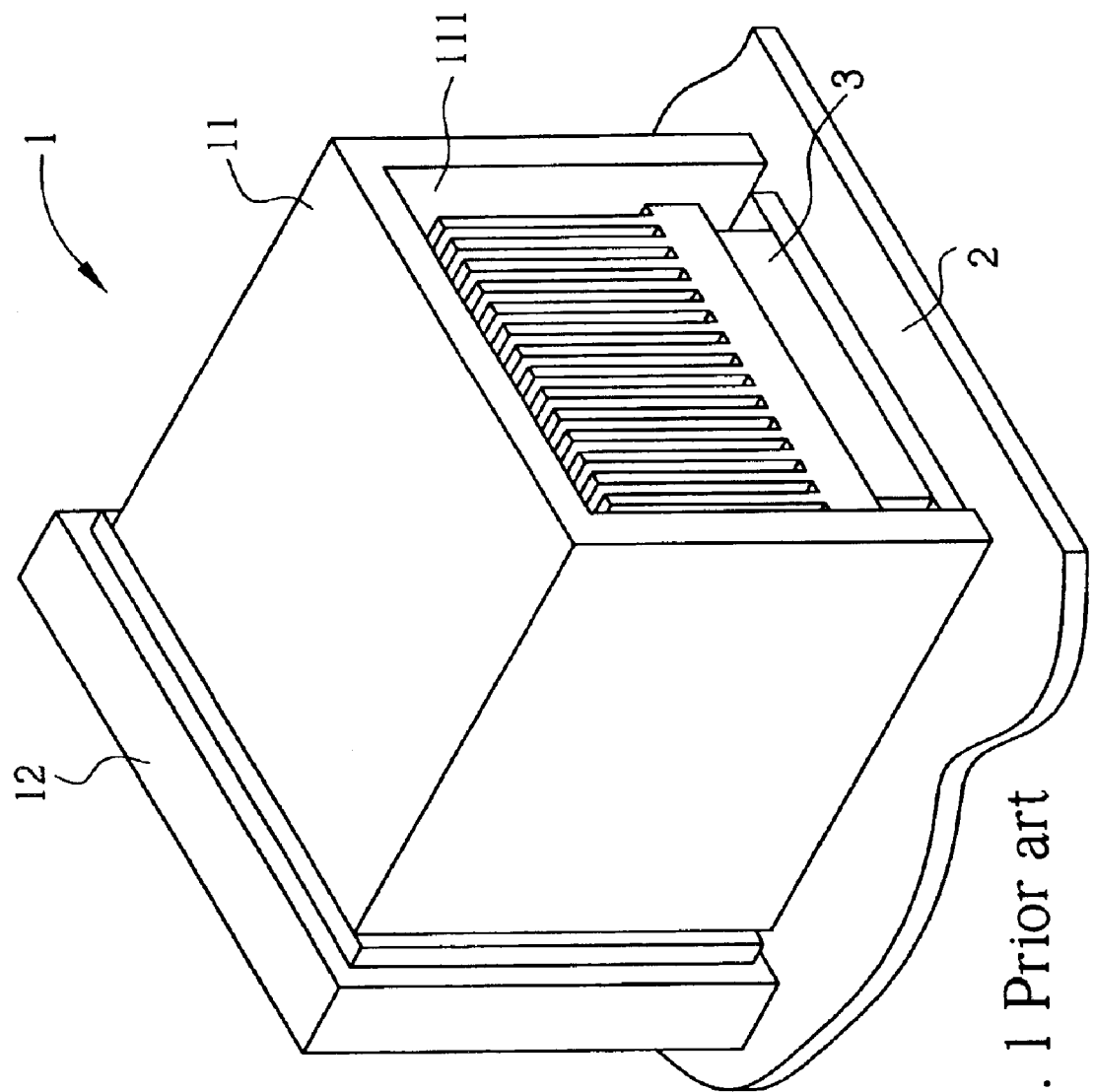
FIG. 1 is a perspective diagram of a prior art heat-dissipating apparatus installed inside a host of a server.
Figure 2:
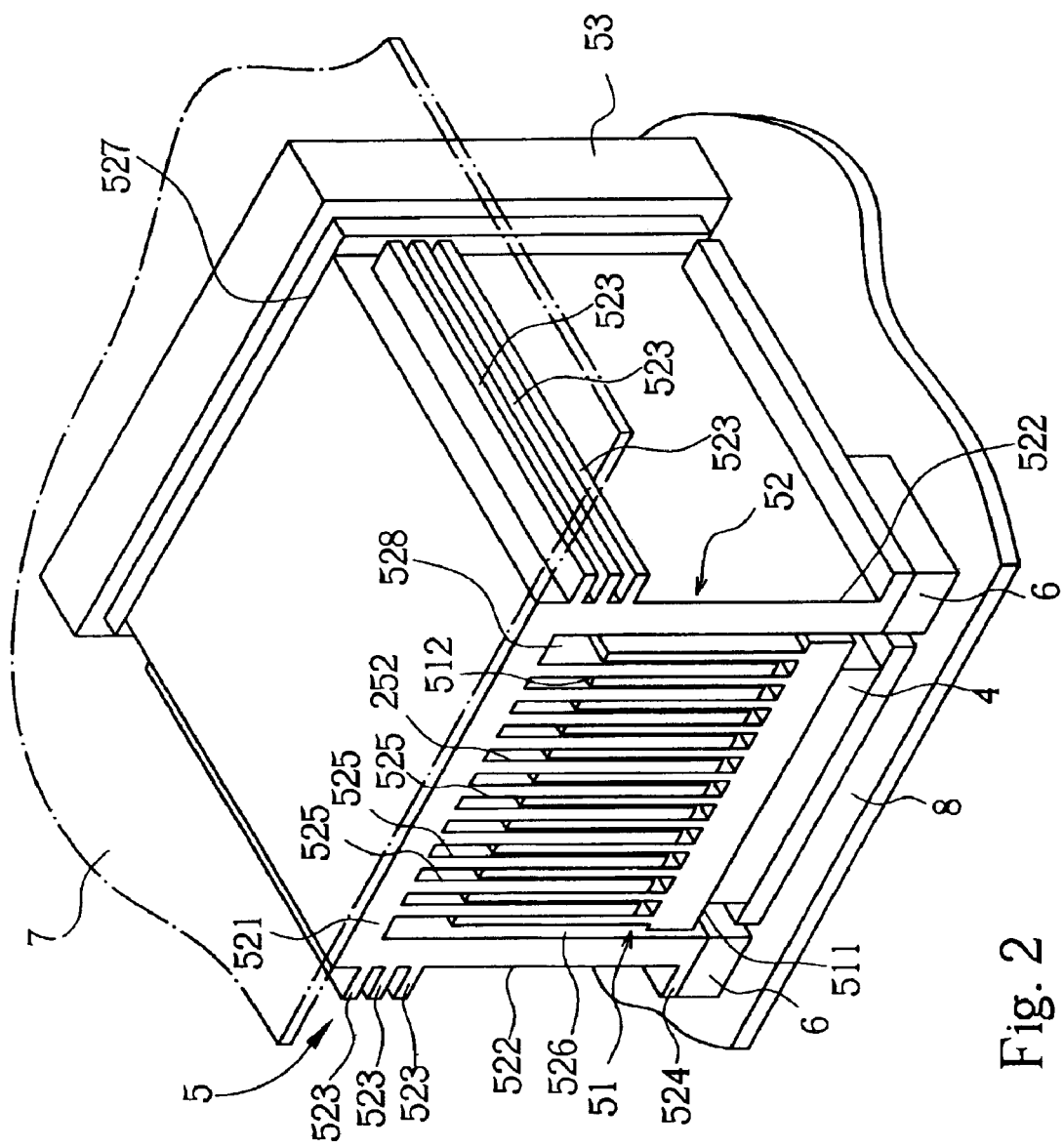
FIG. 2 is a perspective diagram of an integrated heat-dissipating module installed inside a computer host according to the preferred embodiment of the present invention.

As shown in FIG. 2, an integrated heat-dissipating module 5 of the present invention comprises a heat-dissipating device 51 attached to a main heat-generating source 4, a casing 52 substantially in contact with sub heat-generating sources 6 and installed around the heat-dissipating device 51 and the main heat-generating source 4, and a heat-dissipating fan 53 connected to the casing 52.

The casing 52 is made of a high heat conducting material such as aluminum (Al) or copper (Cu), so that it has a highly conductive characteristic. Additionally, the casing 52 comprises a top plate 521 positioned above the main heat-generating source 4 and attached to a lower surface of a computer housing 7, two side plates 522 extending downward from two opposite sides of the top plate 521 and respectively positioned on opposite sides of the main heat-generating source 4, a plurality of external heat-dissipating fins 523 extending outward from outer surfaces of the side plates 522, and two connecting plates 524 respectively extending outward from bottoms of the side plate 522 onto the sub heat-generating sources 6 that are separately positioned on the opposite sides of the main heat-generating source 4. The computer housing 7 is made of metal, while an upper surface of the top plate 521 of the casing 52 and a lower surface of the connecting plate 524 are respectively attached to the computer housing 7 and the sub heat-generating sources 6 via heat-conducting adhesive tapes (not shown in FIG. 2) made of a thermal interface material (TIM). In addition, the heat-conducting adhesive tapes are so thin that the top plate 521 and the connecting plates 524 of the casing 52 are almost directly in contact with the computer housing 7 and the sub heat-generating sources 6 respectively. Furthermore, because the heat-conducting adhesive tapes are excellent conductors, the casing 52 can transmit the heat to the computer housing 7 rapidly and the heat produced by the sub heat-generating sources can also be quickly transmitted to the connecting plates 524. That is, when the sub heat-generating sources 6 produce the heat after they are operated, the connecting plates 524 can quickly transmit the heat out from the sub heat-generating sources 6. Then, a portion of the heat produced by the sub heat-generating sources 6 is rapidly conducted to a space outside the casing 52 via the external heat-dissipating fins 523 and is dissipated naturally by the system. Simultaneously, due to the heat conduction of the side plates 522 and the top plate 521 of the casing 52, the heat produced by the sub heat-generating sources 6 is transmitted to the outside of the computer housing 7 through the computer housing 7 for reducing temperatures of the sub heat-generating sources 6.

Furthermore, the casing 52 further comprises a plurality of internal heat-dissipating fins 525, whose functions are described as follows, spaced at intervals and extending from an inner surface of the top plate 521 to an inward of the casing 52. Additionally, a first vent 527 and a second vent 526 are respectively defined at a front end and a rear end of the casing 52 for connecting inward and outward areas of the casing 52. The heat-dissipating fan 53 is fastened to the top plate 521 and the side plates 522 of the casing 52 by use of screws (not shown) for sealing the first vent 527, and the heat-dissipating fan 53 is an axial flow type fan. When the heat-dissipating fan 53 is running, the airflow flows from the first vent 527 to the second vent 526, so that the cool air outside the casing 52 is guided into the inward of the casing 52 and flows outwardly from the second vent 526. Because of the shield of the casing 52, a large quantity of airflow formed by the heat-dissipating fan 53 is concentrated within the casing 52 and the function of the airflow will be described as follows.

Certainly, the heat-dissipating fan 53 can also be fastened to the casing 52 by use of rivets or adhesives.

The heat-dissipating device 51 is installed in an inner space 528 defined by the top plate 521 and the side plates 522 of the casing 52. Additionally, the heat-dissipating device 51 comprises a heat-dissipating substrate 511, and a plurality of heat-dissipating fins 512 spaced at intervals and positioned on an upper surface of the heat-dissipating substrate 511. Each of the internal heat-dissipating fins 525 of the casing 52 is located between the two adjacent heat-dissipating fins 512 of the heat-dissipating device 51. A lower surface of the heat-dissipating substrate 511 is adhered to the main heat-generating source 4 through the above-mentioned heat-conducting adhesive tapes so that the heat-dissipating substrate 511 is almost directly in contact with the main heat-generating source 4. Accordingly, the heat produced by the main heat-generating source 4 can be quickly transmitted to the heat-dissipating substrate 511, and then, be transmitted to the heat-dissipating fins 512. In addition, the heat produced by the sub heat-generating sources 6 can be transmitted to each of the internal heat-dissipating fins 525 via the side plates 522 and the top plate 521 of the casing 52. Therefore, all of the heat transmitted from the main heat-generating source 4 to the heat-dissipating fins 512 and the heat transmitted from the sub heat-generating sources 6 to the internal heat-dissipating fins 525 exchange thermal energy with the air inside the casing 52, and then, the heat-dissipating fan 53 dissipates the heat forcedly. Due to the running of the heat-dissipating fan 53, a great quantity of airflow is blown into the casing 52 for speeding up the heat exchange between all of the heat-dissipating fins 512, 525 in the casing 52 and the air inside the casing 52. Accordingly, the heat produced by the main heat-generating source 4 and the sub heat-generating sources 6 is transmitted to the air inside the casing 52 whose temperature is therefore raised to become hot air. Then, the hot air flows along a direction of the airflow produced by the heat-dissipating fan 53 to the second vent 526 and is ejected from the second vent 526 for dissipating the heat produced by the main heat-generating source 4 and dissipating the heat produced by the sub heat-generating sources 6 concurrently. As a result, the main heat-generating source 4 and the sub heat-generating sources 6 can be maintained within a suitable range of operating temperatures for running regularly.

Compared to the prior art, when the integrated heat-dissipating module 5 is installed on the motherboard 8, the heat produced by the main heat-generating source 4 can be continuously and quickly dissipated due to the thermal conduction of the heat-dissipating device 51 and a great quantity of the airflow inside the casing 52 produced by the heat-dissipating fan 53. Accordingly, the main heat-generating source 4 can be operated under a normal operating temperature. Moreover, because the casing 52 made of the high heat conducting material is in contact with the sub heat-generating sources 6 installed near the main heat-generating source 4 and the top plate 521 of the casing 52 is adhered to the computer housing 7, the heat produced by the sub heat-generating sources 6 can be transmitted to the external heat-dissipating fins 523 of the casing 52 and be radiated naturally by the system. Simultaneously, the heat produced by the sub heat-generating sources 6 can also be transmitted to the internal heat-dissipating fins 525 of the casing 52 and be forcedly dissipated by the heat-dissipating fan 53. Moreover, the heat produced by the sub heat-generating sources 6 can further be transmitted to the computer housing 7 via the casing 52 and be ejected to the outside of the computer housing 7. Therefore, the heat produced by the sub heat-generating sources 6 can be quickly dissipated. As a result, the present invention can perform heat dissipation simultaneously for the main heat-generating source 4 and the sub heat-generating sources 6, so that main heat-generating source 4 and the sub heat-generating sources 6 are maintained within a normal range of operating temperatures without installing other devices to perform heat dissipation for the sub heat-generating sources 6. Therefore, the present invention can effectively improve a heat-dissipating efficiency and reduce a temperature within the host under the cost-saving and space-saving condition.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. An integrated heat-dissipating module for dissipating heat generated by a main heat-generating source installed on a computer motherboard and a sub heat-generating source installed around the main heat-generating source, the integrated heat-dissipating module comprising:

a heat-dissipating device having a heat-dissipating substrate in contact with the main heat-generating source for absorbing the heat generated by the main heat-generating source, and a plurality of heat-dissipating fins alternately positioned on an upper surface of the heat-dissipating substrate, the heat absorbed by the heat-dissipating substrate being transmitted to the heat-dissipating fins;

a casing made of a heat-conducting material having a top plate positioned above the main heat-generating source, two side plates extending downward from two opposite sides of the top plate, two connecting plates extending outward from bottoms of the side plates, and a plurality of external heat-dissipating fins extending outward from outer surfaces of the side plates, the side plates being respectively positioned on opposite sides of the main heat-generating source and the connecting plates being in contact with the sub heat-generating source for transmitting the heat generated by the sub heat-generating source to the external heat-dissipating fins, wherein a first vent is defined at a front end of the casing and a second vent is defined at a rear end of the casing; and a heat-dissipating fan installed on the first vent for dissipating the heat absorbed by the heat-dissipating device from the casing via the second vent.

2. The integrated heat-dissipating module of claim 1 wherein the casing further comprises a plurality of internal heat-dissipating fins spaced at intervals and extending downward from an inner surface of the top plate, and the internal heat-dissipating fins are interlaced with the external heat-dissipating fins of the heat-dissipating device.

3. The integrated heat-dissipating module of claim 2 wherein the top plate of the casing is attached to a computer housing.

4. The integrated heat-dissipating module of claim 1 wherein the heat-conducting material comprises copper (Cu).

5. The integrated heat-dissipating module of claim 1 wherein the heat-conducting material comprises aluminum (Al).

6. The integrated heat-dissipating module of claim 1 wherein the heat-dissipating fan comprises an axial flow type fan.

* * * * *